(12) United States Patent
Burns

(10) Patent No.: US 6,531,923 B2
(45) Date of Patent: Mar. 11, 2003

(54) LOW VOLTAGE INPUT CURRENT MIRROR CIRCUIT AND METHOD

(75) Inventor: Lawrence M. Burns, Laguna Hills, CA (US)

(73) Assignee: Broadcom Corporation, Irvine, CA (US)

(*) Notice: Subject to any disclaimer, the term of this patent is extended or adjusted under 35 U.S.C. 154(b) by 57 days.

(21) Appl. No.: 09/897,045

(22) Filed: Jul. 3, 2001

(65) Prior Publication Data

US 2002/0014921 A1 Feb. 7, 2002

Related U.S. Application Data

(60) Provisional application No. 60/221,835, filed on Jul. 28, 2000, and provisional application No. 60/215,850, filed on Jul. 3, 2000.

(51) Int. Cl.[7] ............................................. H03F 3/04
(52) U.S. Cl. ............................... 330/296; 330/288
(58) Field of Search ............................ 330/288, 289, 330/296

(56) References Cited

U.S. PATENT DOCUMENTS

| | | | | |
|---|---|---|---|---|
| 4,518,869 A | * | 5/1985 | Herold | 307/350 |
| 4,983,929 A | * | 1/1991 | Real et al. | 330/288 |
| 5,164,614 A | | 11/1992 | Maekawa | 307/296.1 |
| 5,686,824 A | | 11/1997 | Rapp | 323/313 |
| 5,739,719 A | | 4/1998 | Tanabe et al. | 327/543 |
| 5,812,024 A | * | 9/1998 | Mastrocola | 330/9 |
| 5,892,394 A | | 4/1999 | Wu | 327/546 |
| 6,025,792 A | | 2/2000 | Smith | 341/155 |

FOREIGN PATENT DOCUMENTS

| EP | 0 356 020 A1 | 2/1990 | G05F/3/24 |
|---|---|---|---|
| EP | 0 846 997 A2 | 6/1998 | G05F/3/24 |

OTHER PUBLICATIONS

International Search Report issued Feb. 11, 2002 for Appln. No. PCT/US01/21033, 7 pages.

* cited by examiner

*Primary Examiner*—Benny Lee
*Assistant Examiner*—Henry Choe
(74) *Attorney, Agent, or Firm*—Sterne, Kessler, Goldstein & Fox P.L.L.C.

(57) ABSTRACT

A low voltage current mirror circuit (also referred to as a bias circuit) for establishing a plurality of bias voltages from an input current supplied to an input terminal of the circuit includes an input stage, a current stage connected to the input stage, a feedback stage connected to the current stage, a reference bias stage connected to the feedback stage and the current stage. The circuit establishes first and second bias voltages suitable for biasing current sources of a first type, and third and fourth bias voltages suitable for biasing current sources of a second type complementary to the first type. The bias voltages track the input current over variations in at least one of process, temperature and power supply voltage.

24 Claims, 10 Drawing Sheets

Minimum VDS Bias Circuit

FIG. 2: Minimum VDS Bias Circuit

Using A Resistor To Supply Input Bias Current

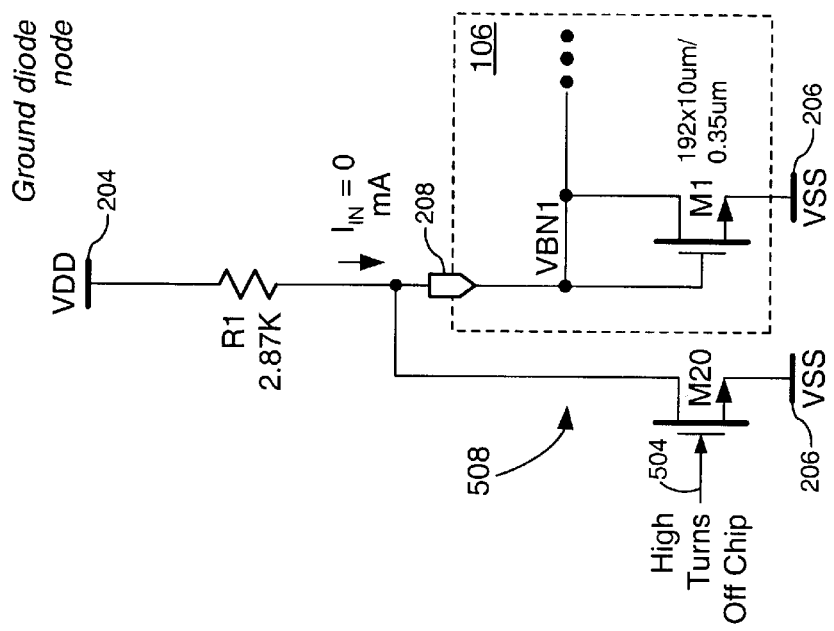
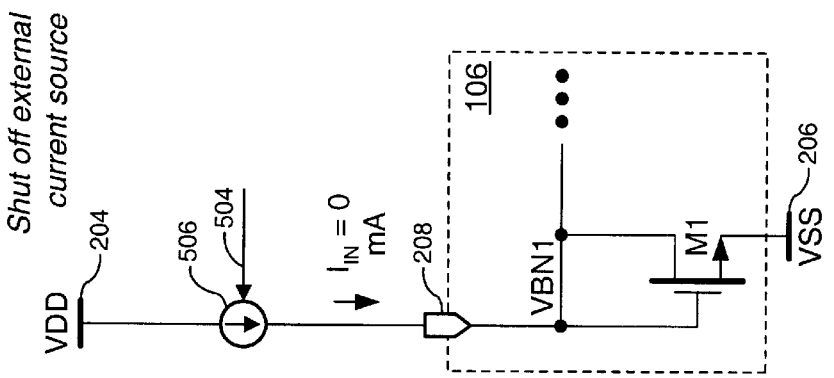
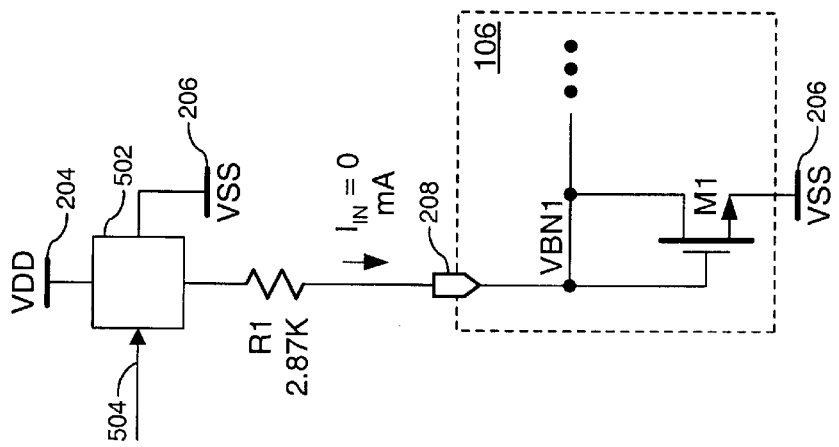
FIG. 5C
FIG. 5B
FIG. 5A

Simple Current Mirror

Cascode Current Mirror

Self-Biased Current Mirror With Resistor

Bandgap Voltage Reference

US 6,531,923 B2

LOW VOLTAGE INPUT CURRENT MIRROR CIRCUIT AND METHOD

CROSS-REFERENCE TO RELATED APPLICATIONS

The present application claims priority to the U.S. Provisional application entitled "Low Voltage Input Current Mirror," Serial No. 60/221,835, filed on Jul. 28, 2000, and also to the U.S. Provisional application entitled "Universal Cable Tuner RF Front End Chip," Serial No. 60/215,850, filed Jul. 3, 2000, each of which is incorporated herein in its entirety by reference.

BACKGROUND OF THE INVENTION

1. Field of the Invention

The present invention relates generally to bias circuits, and more particularly, to such a bias circuit for establishing bias voltages suitable for biasing current sources.

2. Related Art

FIG. 7A is a circuit diagram of a known, simple current mirror including an input diode M31 and a current source Field Effect Transistor (FET) M32. The simple current mirror simply replicates (perhaps proportionately) the input diode current $I_{IN2}$ as an output current $I_{OUT2}$. While this circuit is simple, a problem can arise because the drain-source voltage of FET M31 is not necessarily equal to the drain-source voltage of FET M32. This causes the current $I_{OUT2}$ flowing through FET M32 to be different from the current $I_{IN2}$ flowing through diode M31. This is especially the case for devices having relatively short channels (also referred to as short-channel devices), such as sub-micron devices.

FIG. 7B is a circuit diagram of a known cascode current mirror used to solve the above-mentioned problem. The cascode current mirror keeps the drain-source voltages of both FETs M33 and M34 the same. However, the voltage at the top of FET M35 (that is, on the drain of FET M35) can be relatively high, perhaps more than ½ the power supply voltage VDD. Therefore, changes in voltage VDD cause significantly larger corresponding changes in input current. All of this amounts to a circuit having the disadvantage of very high power supply sensitivity (that is, an undesired sensitivity to power supply voltage variations).

FIG. 7C is a circuit diagram of a self-biased current mirror used to overcome the above-mentioned power supply sensitivity. The current through M42 is basically the voltage across diode M41 divided by the resistance of R10. This current can then be mirrored to the output through the p-type Metal Oxide Semiconductor (PMOS) devices M44–M46. Such self-biased reference circuits also need a start-up circuit to ensure they attain a proper operating state. The circuit of FIG. 7C tends to have the disadvantage that currents in the circuit tend to vary in undesired or wrong directions over process and temperature variations. Also, the input current can not be conveniently adjusted.

FIG. 7D is a bandgap circuit using parasitic bipolar transistors in a Complementary Metal Oxide Semiconductor (CMOS) substrate to create controlled reference voltages. One voltage goes as delta-VBE and the other goes as KT/q multiplied up. Since the temperature coefficients of each of these voltages go in opposite directions, a temperature independent voltage can be achieved. However, bandgap references tend to require a start-up circuit to ensure proper operation thereof. Also, the bandgap circuit is not space-efficient because of the large area required by the PNP transistors used in the circuit. PNP transistors are lateral (not vertical) devices with poor beta and very low maximum current.

There is a need therefore for an improved bias circuit that overcomes all of the above-mentioned shortcomings and disadvantages of known circuits.

SUMMARY OF THE INVENTION

Summary

The present invention overcomes the above-mentioned shortcomings and disadvantages of know circuits. The present invention is directed to a low voltage input current mirror circuit (also referred to as a bias circuit) for establishing a plurality of bias voltages from an input current supplied to an input terminal of the bias circuit. In one embodiment, the circuit includes an input stage adapted to establish a first bias voltage at the input terminal in response to the input current. The circuit further includes a current stage adapted to produce a bias current and a main mirror current each proportional to the input current in response to the first bias voltage and a second bias voltage. The circuit further includes a feedback stage adapted to produce a feedback current proportional to the input current in response to the bias current and the main mirror current. The circuit further includes a reference bias stage adapted to establish the second bias voltage in response to the feedback current from the feedback stage, whereby the first and second bias voltages track the input current over variations in at least one of process, temperature and power supply voltage.

Another aspect of the present invention is a method of establishing a plurality of bias voltages suitable for biasing current sources from an input current supplied to a bias circuit. The method comprises the steps of (a) supplying an input current, (b) establishing a first bias voltage in response to the input current, (c) producing a bias current proportional to the input current in response to the first bias voltage and a second bias voltage, (d) producing a main mirror current proportional to the input current in response to the first bias voltage and the second bias voltage, (e) producing a feedback current proportional to the input current in response to the bias current and the main mirror current, and (f) establishing the second bias voltage in response to the feedback current, whereby the first and second bias voltages track the input current over variations in at least one of a temperature and a power supply voltage of the bias circuit.

Features and Advantages

A. The bias circuit of the present invention is more space-efficient, physically smaller, and less complex than known bandgap reference circuits.

B. The bias circuit of the present invention exhibits much lower thermal noise than the bandgap reference circuit, for example, when an external capacitor to ground is used across an input stage of the bias circuit.

C. The bias circuit of the present invention uses an external resistor to set an input current to the bias circuit, allowing for a trade-off between performance and power.

D. The bias circuit of the present invention includes a shut-down stage or mechanism to selectively turn-off an input current to the bias circuit.

E. The bias circuit of the present invention generates reference voltages compatible with complementary types of logic, such as NMOS and PMOS reference circuits.

F. The bias circuit of the present invention has low power supply sensitivity.

G. The bias circuit of the present invention produces reference currents and bias voltages that vary only slightly with process, temperature and power supply voltage. These variations tend to partially compensate gain variations, without increasing distortion.

BRIEF DESCRIPTION OF THE FIGURES

The features, objects, and advantages of the present invention will become more apparent from the detailed description set forth below when taken in conjunction with the drawings in which like reference characters identify the same or similar elements throughout and wherein:

FIG. 5A is a circuit diagram of a shut-down stage according to an embodiment of the present invention.

FIG. 5B is a circuit diagram of a shut-down stage according to another embodiment of the present invention.

FIG. 5C is a circuit diagram of a shut-down stage according to still another embodiment of the present invention.

DETAILED DESCRIPTION OF THE INVENTION

Overview

Figure 1:
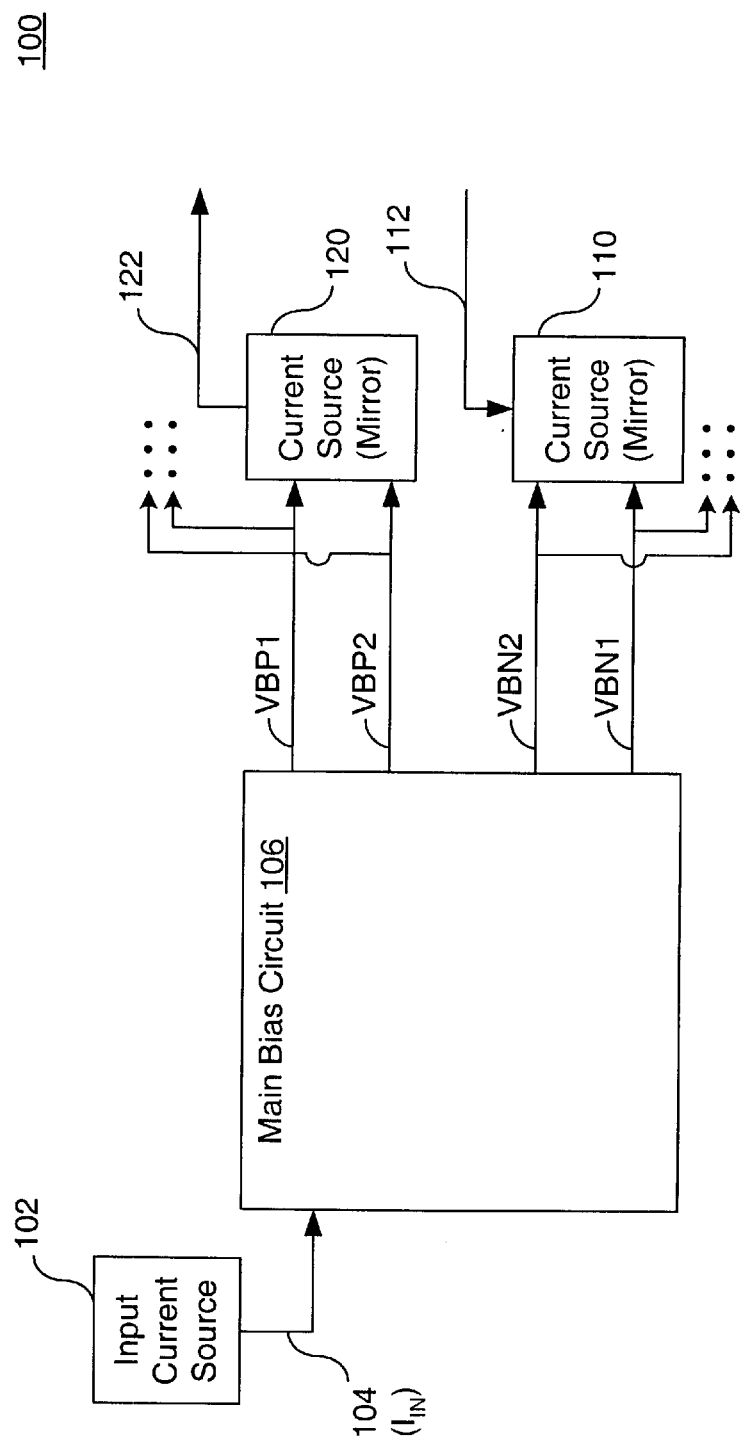
FIG. 1 is a high-level block diagram of an example low voltage input current mirror circuit (bias circuit) according to the present invention.

FIG. 1 is a high-level block diagram of an example low-voltage input current mirror circuit 100 (also referred to as bias circuit 100), according to the present invention. Bias circuit 100 includes an input current source 102 for supplying an input current 104 ($I_{IN}$) to a main circuit portion 106 (also referred to as circuit 106), to be described in detail below. In response to input current 104, circuit 106 establishes a first set of bias voltages VBN1 and VBN2, as well as a second set of bias voltages VBP1 and VBP2. Circuit 106 applies bias voltages VBN1/VBN2 to a current source 110 of a first type compatible with the first set of voltages. Current source 110 produces a current 112 in response to bias voltages VBN1/VBN2. Similarly, circuit 106 applies bias voltages VBP1/VBP2 to a current source 120 of a second type complementary to the first type and compatible with the second set of bias voltages. Current source 120 produces a current 122 in response to bias voltages VBPI/VBP2. In one arrangement of the present invention, current sources 110 and 120 are respectively NMOS and PMOS cascode current sources. In the art, NMOS current sources are generally referred to as current sinks, while PMOS current sources are generally referred to as current sources.

Figure 2:
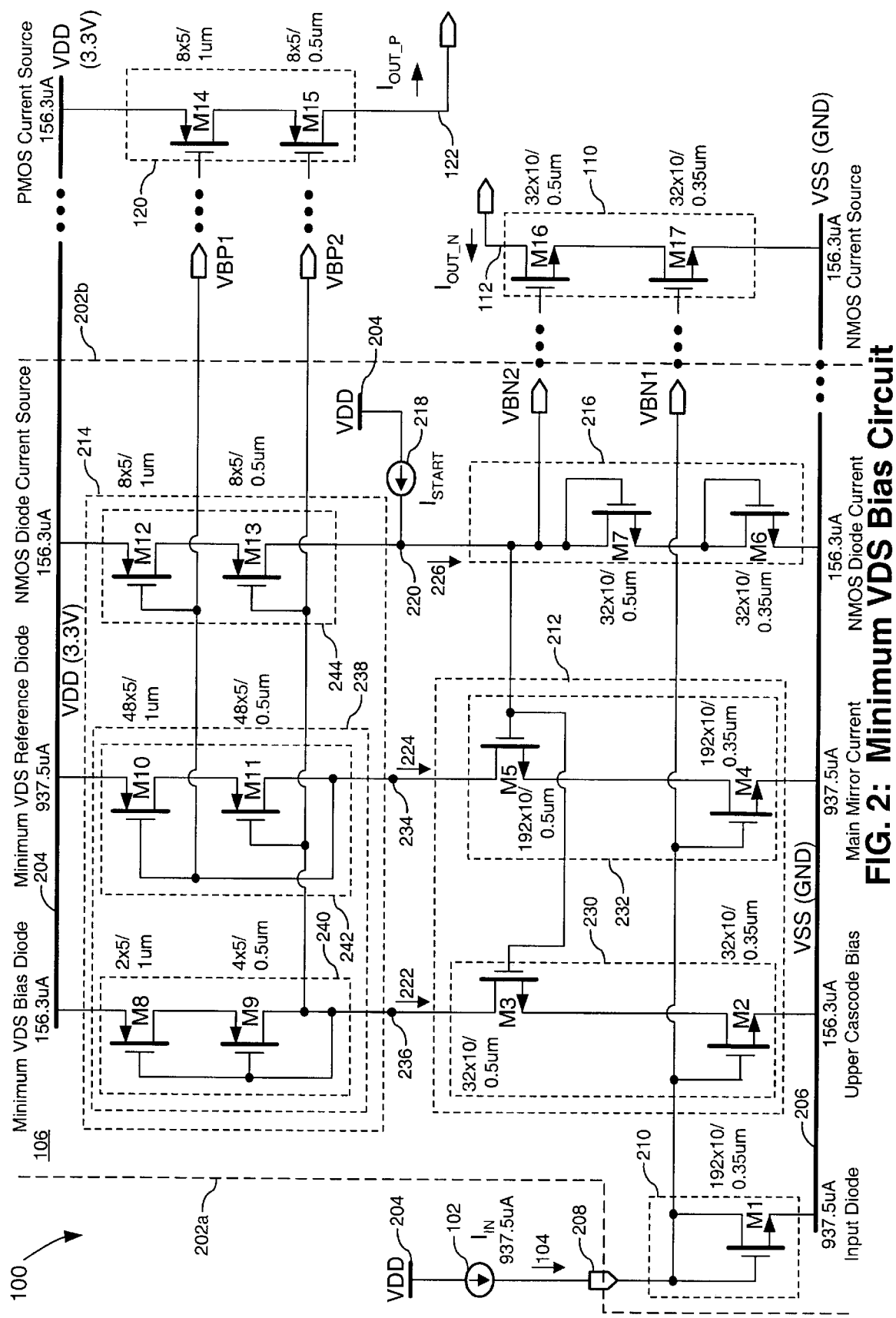
FIG. 2 is a circuit diagram expanding on the circuit of FIG. 1.

FIG. 2 is a circuit diagram expanding on bias circuit 100 of FIG. 1. Depicted in FIG. 2 are input current source 102, main circuit portion 106 (depicted centrally in FIG. 2 between vertical lines 202a and 202b), and current sources 110 and 120 (on the right side of FIG. 2). In an integrated circuit embodiment of the present invention, main circuit portion 106 is constructed on an integrated circuit (IC) chip, and input current source 102 is external to the IC chip. In the integrated circuit embodiment, one or more current sources, such as current sources 110 and 122, may be external to the IC chip, internal to the IC chip, or both external and internal to the IC chip.

A first power supply rail 204 and a second power supply rail 206 supply power to bias circuit 100. In an exemplary arrangement, first power supply rail 204 applies a voltage VDD (for example, 3.3 Volts) to bias circuit 100, while second power supply rail 206 applies a voltage VSS (corresponding to a ground (GND) potential) to bias circuit 100.

Current source 102, connected between first power supply rail 204 and an input terminal 208 of circuit 106, supplies input current $I_{IN}$ (corresponding to current 104 in FIG. 1) to the input terminal. Circuit 106 includes an input stage 210 connected to input terminal 208, and a current stage 212 connected to input stage 210. Circuit 106 also includes a feedback stage 214 connected to current stage 212, and a reference bias stage 216 connected to both current stage 212 and feedback stage 214. Circuit 106 further includes a start-up stage or circuit 218 connected between first power supply rail 204 and a terminal 220 common to both feedback stage 214 and reference bias stage 216.

A brief operational overview of bias circuit 100 is now provided. Input stage 210 establishes bias voltage VBN1 at input terminal 208 in response to input current $I_{IN}$ supplied to the input stage. Current stage 212, also connected to input terminal 208, produces a bias current 222 and a main mirror current 224 in response to both bias voltage VBNI and bias voltage VBN2, such that the two currents are proportional to input current $I_{IN}$. In response to bias and main mirror currents 222 and 224, feedback stage 214 produces a feedback current 226 proportional to input current $I_{IN}$. Reference bias stage 216 produces bias voltage VBN2 in response to feedback current 226. The above-described feedback arrangement, along with other circuit characteristics to be described later, causes the bias voltages VBN1/VBN2 to track input current $I_{IN}$ over variations in process, temperature, and power supply voltage (for example, variations in VDD and VSS).

Detailed Circuit Description

A detailed circuit description of bias circuit 100 is now provided. Example bias circuit 100 depicted in FIG. 2 is constructed using n-type Metal Oxide Semiconductor Field Effect Transistors (MOSFETs) and p-type MOSFETs (that is NMOS and PMOS FETs). Each FET also includes a bulk (or substrate) connection terminal, not shown. It is assumed the NMOS FET substrates are connected to VSS (GND) and the PMOS FET substrates are connected to VDD. the bulk Each FET includes drain, source, and gate or control electrodes. Each FET depicted in FIG. 2 includes a directional arrow identifying the source of the FET. An arrow pointing away from the gate indicates an NMOS FET, while an arrow pointing toward the gate indicates a PMOS FET.

Each of the FETs depicted in FIG. 2 represents an aggregate of many smaller FETs connected together (that is, in parallel with one another) to form one, larger aggregate FET (such as FETs M1, M2, and so on, depicted in FIG. 2). An advantage of constructing such an aggregate FET is that the size and thus current carrying capability (and associated voltage drops produced by) the aggregate FET can be carefully controlled. Most of the FETs of bias circuit 100 are sub-micron devices. This means each of the smaller individual FETs used to construct an aggregate FET has a minimum channel width below one micron (for example, a channel width of 0.35 microns). For example, FET M2 includes thirty-two (32) individual FETs, each having a channel size, represented herein in terms of channel width (W) and channel length (L), of approximately 10 microns (W) by 0.35 microns (L).

It is to be understood the present invention can be constructed using devices other than FETs. For example NPN and PNP bipolar transistors or a mix of such bipolar transistors and field effect transistors can be used, as would be apparent to one skilled in the relevant art after having read the description of the present invention.

Input stage (210)

Input stage 210 includes an input NMOS FET M1 configured to operate as a diode and connected between input terminal 208 and second power supply rail 206. The input configuration including power supply rail 204, current source 102, FET diode Ml, and power supply rail 206, establishes a gate-source voltage and a drain-source voltage of FET M1 corresponding to input current $I_{IN}$. The drain-source voltage across FET M1 also appears across input terminal 208 and power supply rail 206, and establishes bias voltage VBN1 at input terminal 208. Input diode M1 is a relatively large device, and thus establishes a relatively low voltage, between 500 and 600 milliVolts (mV), for example, at input terminal 208. This relatively low voltage has the advantage of desensitizing circuit 106 to fluctuations in voltage VDD.

Current stage (212)

Current stage 212, connected to input diode M1, includes a main mirror current stage 232 for producing main mirror current 224, and a bias current stage 230 for producing bias current 222.

Main mirror current stage 232 includes a first NMOS FET M4 for setting a value of main mirror current 224 and a second FET M5 connected to FET M4 in a cascode configuration. FET M4 has a gate connected to input terminal 208 and a source connected to power supply rail 206. This establishes a gate-source voltage of FET M4 equal to the gate-source voltage of FET M1. Cascode FET M5 includes a source-drain path connected between the drain of FET M4 and a terminal 234 such that the respective source-drain current paths of FETs M4 and M5 are connected in series with one another and are connected together between second power supply rail 206 and terminal 234. The gate of FET M5 is connected to an output (terminal 220) of reference bias stage 216, whereby the reference bias stage applies voltage VBN2 to the gate of FET M5. FET M5 operates as a cascode or buffer device in connection with FET M4, to maintain a preferred source-drain voltage across FET M4, as will be further described below. FET M4 is operated in its saturation region.

Bias current stage 230 includes a first NMOS FET M2 for setting a value of bias current 222 and a second FET M3 connected to FET M2 in a cascode configuration. FET M2 has a gate connected to input terminal 208 and a source connected to power supply rail 206. This establishes a gate-source voltage of FET M2 equal to the gate-source voltage of FET M1 (and FET M4). FETs M2 and M3 have their respective source-drain current paths connected in series with one another and are together connected between second power supply rail 206 and a terminal 236. The gate of FET M3 is connected to the output (terminal 220) of reference bias stage 216, whereby the reference bias stage applies voltage VBN2 to the gate of FET M3. FET M3 operates as a cascode or buffer device in connection with FET M2, to maintain a preferred source-drain voltage across FET M2, as will be further described below. FET M2 is operated in its saturation region.

A goal of circuit 106 is to have FETs M2 and M4 replicate precisely input current $I_{IN}$. In other words, the goal is to have FETs M2 and M4 respectively set bias and main mirror currents 222 and 224 proportional to input current $I_{IN}$ flowing through diode M1 over process, temperature, and power supply variations. The reason for this is that circuit 106 uses currents 222 and 224 as reference currents for deriving further currents and bias voltages (for example, bias voltages VBN2, VBP1, and VBP2), and it is desirable that such further currents and bias voltages also track input current $I_{IN}$ over process, temperature, and power supply variations.

When two or more FETs (for example, FETs M1, M2, and M4 in FIG. 2) have (a) equal gate-source voltages, and (b) equal drain-source voltages, the FETs produce currents through their respective source-drain current paths in proportion to their respective sizes. For example, when the FETs are the same size, their respective source-drain currents (also referred to as drain currents) are equal. In other words, their respective drain currents are in the proportion or ratio of 1:1 with respect to one another. When one FET is twice as large as the other FET, the larger FET sets a drain current twice as large as the smaller FET, and so on, assuming equal gate-source and drain-source voltages across the two FETs.

Therefore, to replicate input current $I_{IN}$ flowing through FET M1 in both FETs M2 and M4 (that is, in bias and main mirror currents 222 and 224), circuit 106

(a) sets the gate-source voltage across each of FETs M2 and M4 equal to the gate-source voltage across M1 by circuit connection (as depicted in FIG. 2, and described above), and (b) maintains the drain-source voltage across each of FETs M2 and M4 equal to the drain-source voltage across FET M1 using the above-mentioned feedback configuration including cascode configured FETs M3 and M5, as will be further described below.

Therefore, circuit 106 achieves the goal of matching bias and main mirror currents 222 and 224 to input current $I_{IN}$ (that is, of replicating the input current) over variations in process, temperature, and power supply.

Feedback Stage (214)

Current stage 212 supplies bias current 222 and main mirror current 224 to feedback stage 214. Feedback stage 214 includes a low-voltage reference voltage stage 238 for establishing bias voltages VBP1 and VBP2 in response to bias current 222 and main mirror current 224. Reference voltage stage 238 includes a bias stage 240 for establishing bias voltage VBP2 in response to bias current 222, and a reference stage 242 for establishing bias voltage VBP1 in response to both main mirror current 224 and bias voltage VBP2. Feedback stage 214 also includes a current source 244, connected to both stages 240 and 242, to produce feedback current 226 in response to bias voltages VBP1/VBP2 established by reference voltage stage 238.

Low-Voltage Reference Voltage Stage (238)

Bias stage 240 includes first and second PMOS FETs M8 and M9 having their respective source-drain current paths connected in series with each other and connected together between first power supply rail 204 and terminal 236. The gates of both FETs M8 and M9 are connected to terminal 236 (the drain of FET M9). Bias current 222 flows through FET M8 and establishes the gate-source voltage of FET M8, and thus, voltage VBP2 on the gate of FET M8. The gate of FET M8 applies voltage VBP2 to the drain of FET M9 by direct connection, thereby minimizing the overall voltage drop across the combined source-drain paths of FETs M8 and M9. This arrangement establishes a minimum source-drain voltage across FETs M8 and M9 required to cause the FETs to operate in saturation (as opposed to the triode region). FETs M8 and M9 operate as an aggregate diode. Bias voltage VBP2 has an exemplary value of approximately 1.63 V (that is, 1.67 V below VDD).

Reference stage 242 includes first and second PMOS FETs M10 and M11 having their source-drain paths connected in series with one another and between first power supply rail 204 and terminal 234. The gate of FET M10 is connected to terminal 234 (the drain of FET 11) to minimize the voltage drop across the series-connected source-drain paths of FETs M10 and M11. The gate of FET M11 is connected to terminal 236 (the drain of FET M9), whereby the drain of FET M9 applies voltage VBP2 to the gate of M11. Main mirror current 224 flows through FET M10 and establishes the gate-source voltage of FET M10, and thus, voltage VBP1 on the gate of FET M10. The arrangement minimizes the overall voltage drop across the combined source-drain paths of FETs M10 and M11 while keeping FETs M10 and M11 in saturation (similar to the arrangement of FETs M8 and M9). Bias voltage VBP1 has an exemplary value of approximately 2.2 V (that is, 1.1 V below VDD).

Thus, reference voltage stage 238 can be considered a low-voltage reference stage for establishing bias voltages VBP1/VBP2 in response to currents 222/224. Further, since low-voltage reference stage 238 establishes bias voltages VBP1/VBP2 in response to bias and main mirror currents 222/224, bias voltages VBP1/VBP2 precisely track input current $I_{IN}$ over at least process, temperature, and power supply voltage variations.

PMOS Current Source (244)

Cascode current source 244 includes first and second series-connected PMOS FETs M12 and M13, connected between power supply rail 204 and terminal 220. Reference voltage stage 238 applies bias voltages VBP1 and VBP2 to the respective gates of FETs M12 and M13, whereby current source 244 produces feedback current 226 in response to the bias voltages VBP1/VBP2. Since bias voltages VBP1/VBP2 precisely track input current $I_{IN}$, and since current source 244 produces feedback current 226 in response to the bias voltages, feedback current 226 also precisely tracks current $I_{IN}$.

Reference Bias Stage (216)

Reference bias stage 216 includes an NMOS FET M6 configured as a diode and connected in series with an NMOS FET M7, also configured as a diode. Diodes M6 and M7 are connected in series with one another and are together connected between second power supply rail 206 and terminal 220, so as to produce a voltage drop between the terminal 220 and power supply rail 206 equal to approximately two diode voltage potential drops. Feedback current 226, supplied by current source 244, flows through diodes M6 and M7. In response to feedback current 226, diodes M6 and M7 establish voltage VBN2 at the output of the bias stage 216 (terminal 220). Therefore, voltage VBN2 can be considered a feedback voltage in circuit 106. Since feedback current 226 replicates input current $I_{IN}$ for all of the reasons described above, and since diodes M6 and M7 establish/derive voltage VBN2 in response to feedback current $I_{IN}$, voltage VBN2 also tracks current $I_{IN}$. Bias voltage VBN2 has an exemplary value of approximately 1.33 V.

Reference bias stage 216 applies voltage VBN2 to the respective gates of cascode FETs M3 and M5. Also, bias and mirror currents 222 and 224 flowing through respective FETs M3 and M5 cause respective, corresponding source-gate voltage drops VGS3 and VGS5 in FETs M3 and M5. Since FETs M3 and M5 each have a gate voltage equal to VBN2, FETs M3 and M5 have respective drain voltages VBN2-VGS3 and VBN2-VGS5. Voltages VBN2-VGS3 and VBN2-VGS5 are applied to the respective drains of FETs M2 and M4 by direct connection. Therefore, cascode FETs M3 and M5 respectively establish the source-drain voltages of FETs M2 and M4.

Since voltage VBN2 tracks input current $I_{IN}$ via the feedback mechanism described above, and since voltages VGS3 and VGS5 correspond to respective currents 222 and 224, the present invention controls the source-drain voltages of FETs M2 and M4 in a dynamic, adaptive manner, such that the drain-source voltages of FETs M2 and M4 are maintained equal to the source-drain voltage of FET M1 over process, temperature, and power supply voltage variations.

A summarizing example feedback scenario is now provide. Assume input current $I_{IN}$ is reduced from an initial current value to a reduced current value. In response, the voltage at input terminal 208 (bias voltage VBN1) is correspondingly reduced, and thus, the gate-source voltages of FETs M2 and M4 are correspondingly reduced. In response, currents 222 and 224 are reduced, and the gate voltages of M8 and M10 are directed toward VDD. In response, feedback current 226 is reduced. In response, the voltage drop developed across FETs M6 and M7 is reduced, and thus, the gate voltages of FETs M3 and M5 are reduced. In response, the drain voltages of FETs M2 and M4 are reduced, so they match the reduced drain-source voltage of FET M1. Therefore, all of the voltages and currents track in bias circuit 100.

NMOS and PMOS Current Sources

As discussed in connection with FIG. 1, bias voltages VBN1/VBN2 can be used to control one or more current sources of a first type, such as NMOS current source 110. Cascode current source 110 includes first and second series-connected NMOS FETs M16 and M17 having respective gates driven by bias voltages VBN2 and VBN1. Current source 110 produces current 112 ($I_{OUT-N}$) in response to bias voltages VBN1/VBN2. Since bias voltages VBN1/VBN2 track input current $I_{IN}$, current 112 ($I_{OUT-N}$) replicates input current $I_{IN}$ over process, temperature, and power supply voltage variations.

Similarly, bias voltages VBP1/VBP2 can be used to control one or more current sources of a second type complementary to the first type, such as PMOS current sources 244 and/or 120. The operation of PMOS cascode current source 244 was described above, and need not be described further.

Example Implementation

Table 1 below lists the sizes of FETs M1–M17 according to an example implementation of the present invention.

TABLE 1

| FET | No. of Devices | Device Size W/L ($\mu m$) |
|---|---|---|
| M1 | 192 | 10/0.35 |
| M2 | 32 | 10/0.35 |
| M3 | 32 | 10/0.5 |
| M4 | 192 | 10/0.35 |
| M5 | 192 | 10/0.5 |
| M6 | 32 | 10/0.35 |
| M7 | 32 | 10/0.5 |
| M8 | 2 | 5/1 |
| M9 | 4 | 5/0.5 |
| M10 | 48 | 5/1 |
| M11 | 48 | 5/0.5 |
| M12 | 8 | 5/1 |
| M13 | 8 | 5/0.5 |
| M14 | 8 | 5/1 |
| M15 | 8 | 5/0.5 |
| M16 | 32 | 10/0.5 |
| M17 | 32 | 10/0.35 |

Table 2 below lists various current values flowing in circuit 106 in the example implementation of the present invention.

TABLE 2

| Current Label | Current Value ($\mu A$) |
|---|---|
| Input current $I_{IN}$ | 937.5 |
| Bias current 222 | 156.3 |
| Main mirror current 224 | 937.5 |
| Feedback current 226 | 156.3 |
| PMOS output current 122 | 156.3 |
| NMOS output current 112 | 156.3 |

The FETs depicted in FIG. 2 are connected in a tiered or leveling arrangement, namely:
 a first tier includes FETs M1, M12, M4, M6, and M17;
 a second tier includes FETs M3, M5, M7, and M16;
 a third tier includes FETs M9, M 11, M13, and M15; and
 a fourth tier includes FETs M8, M10, M12, and 14.

With reference to FIG. 2 and table 1 above, it can be seen that in each tier (for example, the first tier), the small FETs used to construct all of the aggregate FETs for the tier (for example, M1, M2, M4, and M6 in the first tier) have the same channel size (for example, W/L=10/.35 microns). On the other hand, the small FETs used to construct aggregate FETs on different tiers do not necessarily have sizes equal to the small FETs used in the first tier.

With reference to FIG. 2, and Tables 1 and 2 above, it can be seen that the aggregate FETs are of such physical transistor dimensions (such as gate length, width and total number of gates) that the current densities in the cascode FETs at the second and third tiers (for example, FETs M3 and M5, and M9 and M11) are the same as the current densities in the corresponding current source FETs at the first and fourth tiers (for example, FETs M2 and M4, and M8 and M10). This further helps the currents and voltages within circuit 106 track one another over temperature and process.

Current Source (102)

Figure 3:
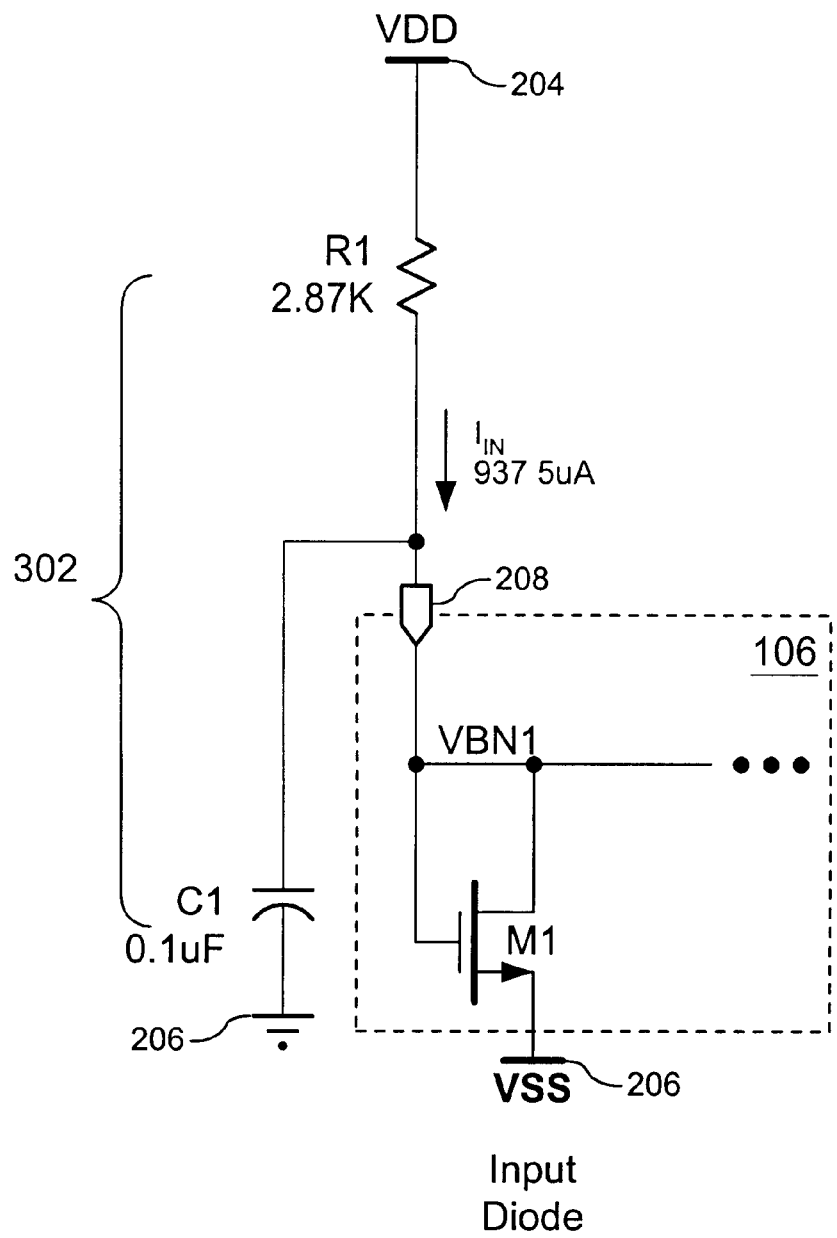
FIG. 3 is a circuit diagram of an example input circuit portion connected to the circuit of FIG. 2.

FIG. 3 is a circuit diagram of an example input circuit portion 302 connected to main circuit portion 106. Input circuit portion 302 includes an input resistor R1 connected between first power supply rail 204 and input terminal 208, to set the value of input current $I_{IN}$. Input resistor R1 is used instead of input current source 102, discussed above in connection with FIGS. 1 and 2. Input circuit portion 302 also includes a bypass capacitor C1 connected between input terminal 208 and second power supply rail 206. Capacitor C1 reduces noise pick-up and also the thermal noise generated by the NMOS FETs of circuit 106 (see FIG. 2). In the integrated circuit embodiment of the present invention mentioned above in connection with FIG. 2, circuit 106 in constructed on an IC chip. In an arrangement of the integrated circuit embodiment, input resistor RI and bypass capacitor C1 are external to the IC chip.

Circuit Start-up Feature

Figure 4C:
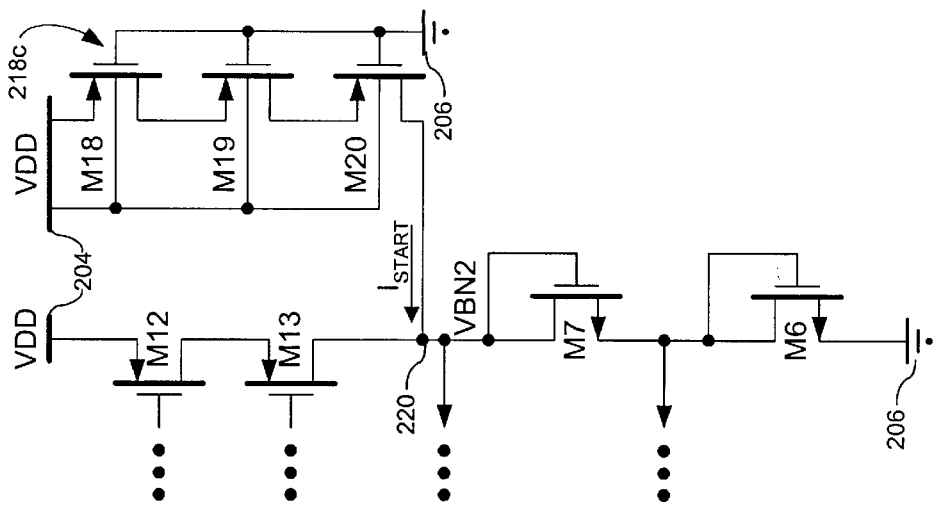
FIG. 4C is a circuit diagram of a start-up circuit according to still another embodiment of the present invention.
Figure 4B:
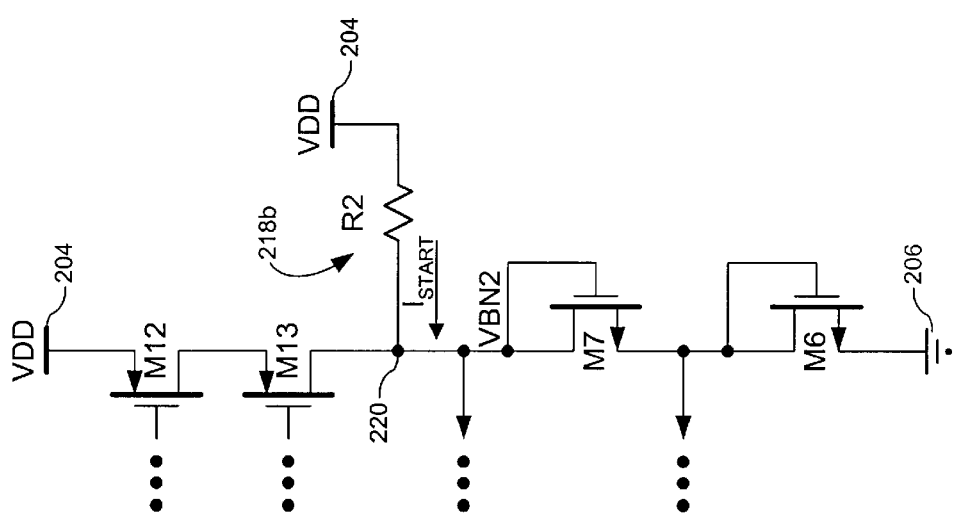
FIG. 4B is a circuit diagram of a start-up circuit according to another embodiment of the present invention.
Figure 4A:
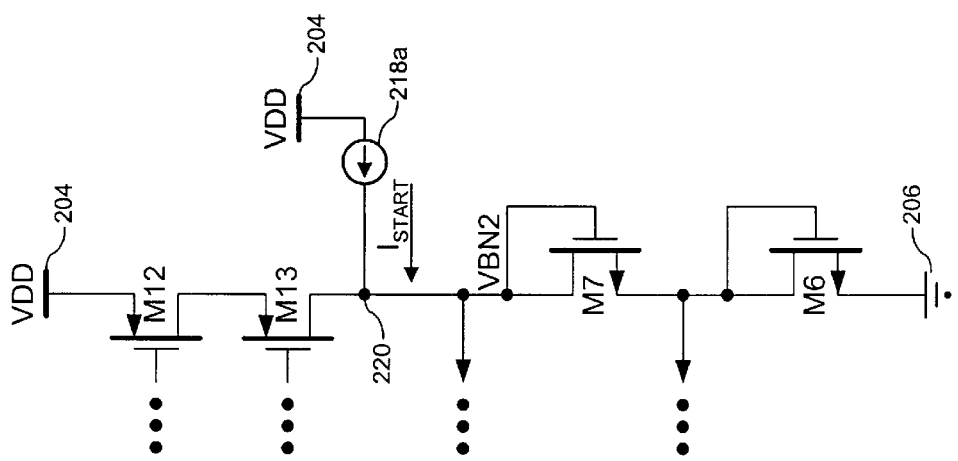
FIG. 4A is a circuit diagram of a start-up stage or circuit according to one embodiment of the present invention.

FIGS. 4A, 4B and 4C are circuit diagrams of start-up stage or circuit 218 according to three different embodiments of the present invention.

With reference to FIG. 4A, a start-up current source 218a, connected between first power supply rail 204 and input terminal 220, supplies an initial trickle or leakage current $I_{START}$ to terminal 220, and thus to diodes M6 and M7 so as to bias the diodes on. In doing so, current source 218 forces circuit 106 into a proper and stable operating condition, that is, to operate as described above. Current source 218a supplies the initial trickle current ($I_{START}$) to diodes M6 and M7 when bias circuit 100 is initially turned-on. As bias circuit 100 begins to operate as described above, bias voltage VBN2 at terminal 220 begins to rise. In response to the rise in voltage VBN2, start-up current source 218a supplies progressively less current ($I_{START}$) to terminal 220. Eventually, start-up current source 218a supplies no current to terminal 220 (and diodes M6 and M7) when bias circuit 100 attains a steady-state, normal operating condition and when the voltage at terminal 220 rises above ground (VSS).

FIG. 4B is a circuit diagram of another example start-up stage 218b. Start-up stage 218b includes a start-up resistor R2 connected between power supply rail 204 and terminal 220. Resistor R2 provides trickle current $I_{START}$ to diodes M6 and M7 so as to bias the diodes on. Resistor R2 supplies current (ISTART) to diodes M6 and M7 in substantially the same manner as does start-up up current source 218a, discussed above in connection with FIG. 4A. However, resistor R2 continues to supply a tiny trickle current to terminal 220, even after bias circuit 100 attains the steady-state operating condition mentioned above. However, the tiny trickle current is sufficiently small as to not degrade the proper operation of bias circuit 100. Resistor R2 is large enough that the current $I_{START}$ flowing through it is small compared to the current 226 from the PMOS current mirror 244. This ensures good accuracy in the bias circuit 100.

FIG. 4C is a circuit diagram of yet another example start-up stage 218c. Start-up stage 218c includes a plurality of, in this case three, series-connected PMOS FETs M18, M19, and M20, having their respective source-drain current paths connected in series with each other, and between first power supply rail 204 and input terminal 220. All of the gates of FETs M18–M20 are connected to second power supply rail 206 (GND). In the depicted configuration, each of FETs M18–M20 operates in its triode region, that is, as a resistor. FETs M18–M20 have relatively long channels (for example, L/W=0.4 um/10 um), that is, the FETs are relatively long-channel devices, which are more space-efficient than resistors, in many cases. Start-up stage 218c supplies start-up current $I_{START}$ to terminal 220 in much the same manner as does start-up resistor R2, as described above in connection with FIG. 4B. An added benefit is that PMOS FETs M18–M20 tend to turn-off as bias voltage VBN2 rises at terminal 220, which as described above, is a desired effect. Turning-off the start-up current $I_{START}$ helps maintain the accuracy of currents and voltages in circuit 106.

Circuit Power-Down Feature

FIGS. 5A–5C are circuit diagrams of three different power-down stages for bias circuit 100. Each power-down stage interrupts the flow of current $I_{IN}$ into circuit 106 to turn-off (that is, "power-down") circuit 106. With reference to FIG. 5A, a shut-down stage 502 includes a switch connected to input resistor R1, first power supply rail 204, and second power supply rail 206. Switch 502 receives a chip enable/disable control signal 504 from an external control source, not shown. In response to enable/disable states of control signal 504, switch 502 selectively connects input resistor R1 to first power supply rail 204 to enable input current $I_{IN}$, and to second power supply rail 206 to disable input current $I_{IN}$ In an alternative arrangement of switch 502, the switch is disconnected from first power supply rail 204 and maintained in an "open" position in response to the disable state of control signal 504, whereby no current can flow through resistor R1.

With reference to FIG. 5B, a shut-down stage 506 includes an input current source (corresponding to input current source 102) which can be turned on and off using enable/disable control signal 504.

With reference to FIG. 5C, a shut-down stage 508 includes a switching FET M20 having a source-drain current path connected between input terminal 208 and second power supply rail 206, and a gate for receiving enable/disable control signal 504. When control signal 504 corresponds to a logic "1," FET M20 is turned-on, and thus shunts input current $I_{IN}$ away from input terminal 208 and toward second power supply rail 206. This turns off circuit 106. On the other hand, when control signal 504 corresponds to a logic "0," FET M20 is turned-off, that is non-conducting, and input current $I_{IN}$ flows into circuit 106. This turns on circuit 106.

Another turn-off stage can include a non-inverting buffer, or alternatively an inverting buffer, having an input driven by a control signal having an appropriate polarity and an output connected to the end of resistor R1 connected to first power supply rail 204.

Methods

Figure 6A:
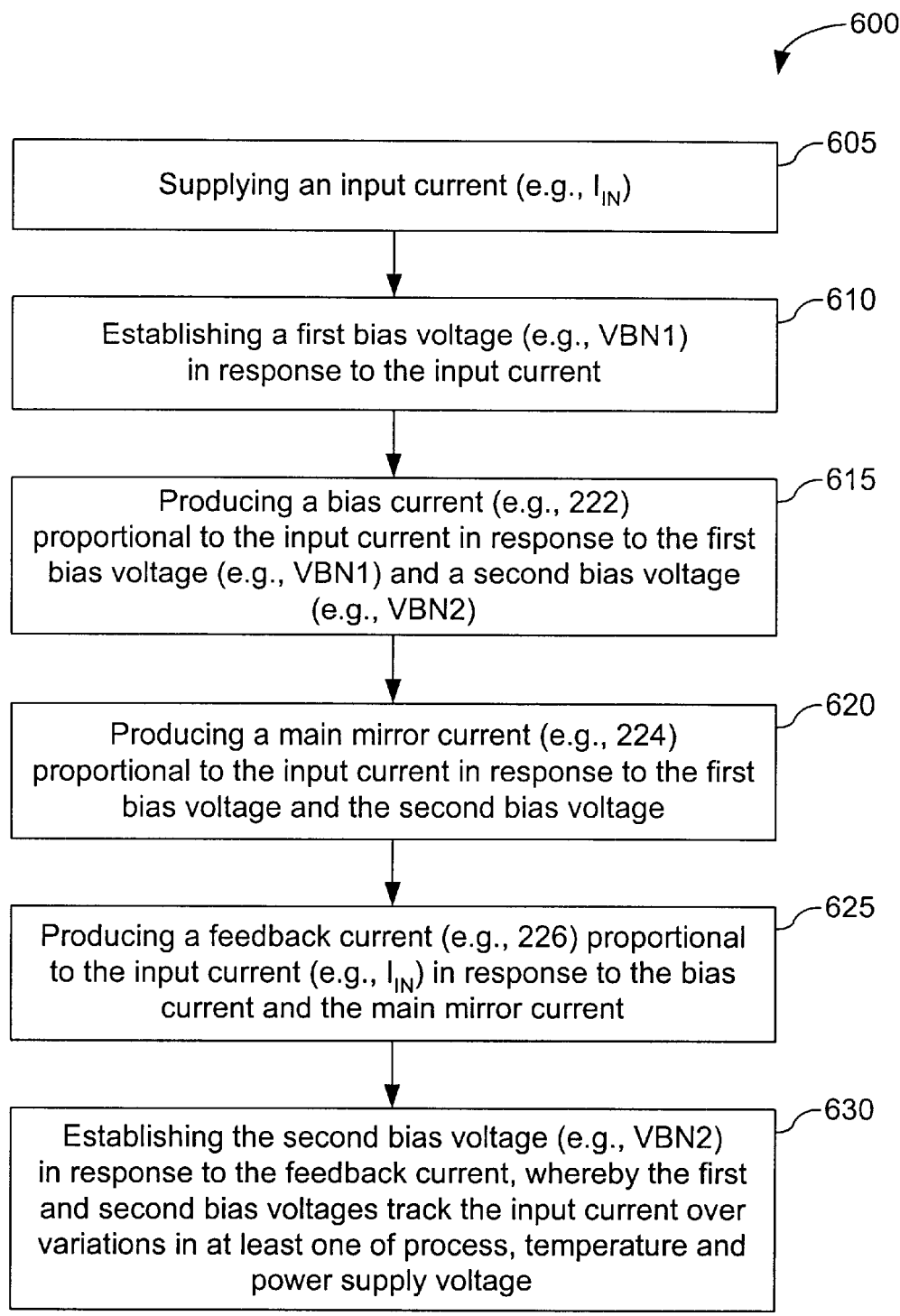
FIG. 6A is a flowchart of an example method of establishing first and second bias voltages from an input current implemented using the circuit of FIG. 2.

FIG. 6A is a flow chart of an example method 600 of establishing first and second bias voltages (and corresponding mirrored currents) from an input current implemented using bias circuit 100. Method 600 includes an initial step 605 of supplying an input current (for example, current $I_{IN}$) to circuit 106.

Method 600 includes a next step 610 of establishing a first bias voltage (for example, bias voltage VBN1) in response to the input current.

Method 600 includes a next step 615 of producing a bias current (for example, current 222) proportional to the input current in response to the first bias voltage (for example, bias voltage VBN1) and a second bias voltage (for example, bias voltage VBN2).

Method 600 includes a next step 620 of producing a main mirror current (for example, current 224) proportional to the input current in response to the first bias voltage and the second bias voltage.

Method 600 includes a next step 625 of producing a feedback current (for example, current 226) proportional to the input current in response to the bias current and the main mirror current.

Method 600 includes a next step 630 of establishing the second bias voltage in response to the feedback current, whereby the first and second bias voltages track the input current over variations in at least one of process, temperature and power supply voltage.

Figure 6B:
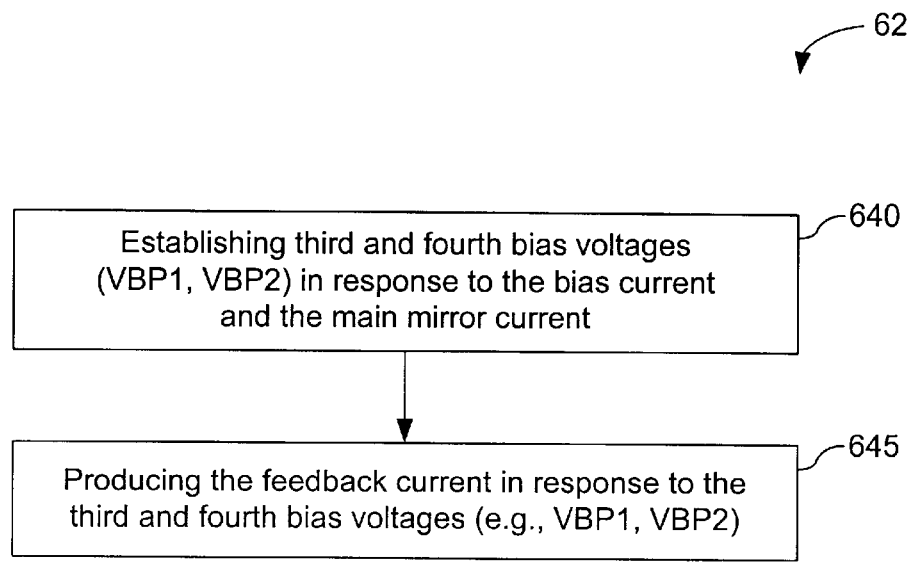
FIG. 6B is a flowchart expanding on the method of FIG. 6A.

FIG. 6B is a flow chart expanding on method step 625 mentioned above in connection with FIG. 6A. Step 625 includes a first step 640 of establishing third and fourth bias voltages (for example, bias voltages VBP1, VBP2) in response to the bias current and the main mirror current produced in previous steps 615 and 620.

Step 625 includes a next step 645 of producing the feedback current in response to the third and fourth bias voltages.

Figure 6C:
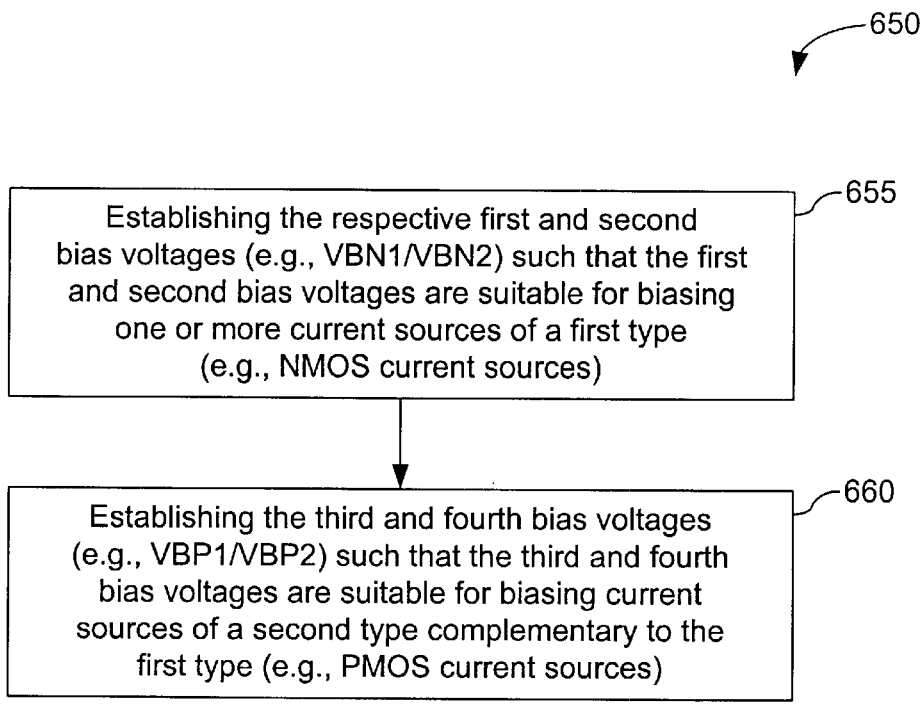
FIG. 6C is a flowchart of an example method further expanding on the method of FIG. 6A.

FIG. 6C is a flow chart of an example method 650 further expanding on method 600. Method 650 includes a first method step 655 (corresponding to steps 610 and 630 of method 600) of establishing the respective first and second bias voltages (for example, VBN1/VBN2) such that the first and second bias voltages are suitable for biasing one or more current sources of a first type (for example, NMOS current sources).

Method 650 includes a second method step 660 (corresponding to steps 640 mentioned above) of establishing the third and fourth bias voltages (for example, bias voltages VBP1/VBP2) such that the third and fourth bias voltages are suitable for biasing current sources of a second type complementary to the first type (for example, PMOS current sources).

Figure 6D:
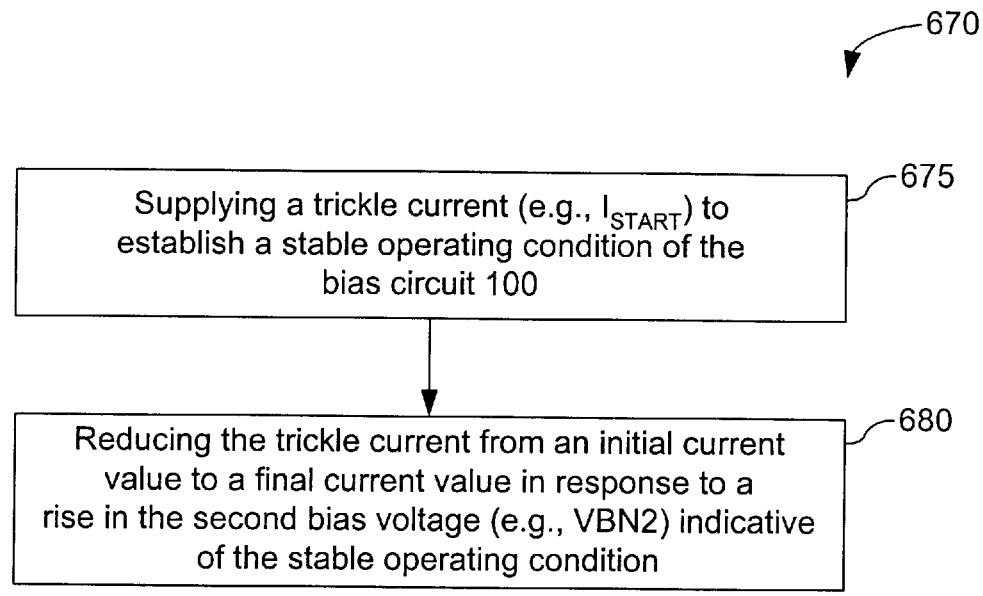
FIG. 6D is a flowchart of an example method of initially establishing a proper operation of the circuit of FIG. 2.

FIG. 6D is a flow chart of an example method 670 of initially establishing or starting-up the proper operation of bias circuit 100. Start-up method 670 includes a first method step 675 of supplying a trickle/leakage current (for example, ISTART) to establish a stable operating condition of the bias circuit 100. Method 670 includes an optional next step 680 of reducing the trickle/leakage current from an initial current value to a final current value in response to a rise in the second bias voltage (for example, VBN2) indicative of a stable, proper operating condition of bias circuit 100.

Figure 6E:
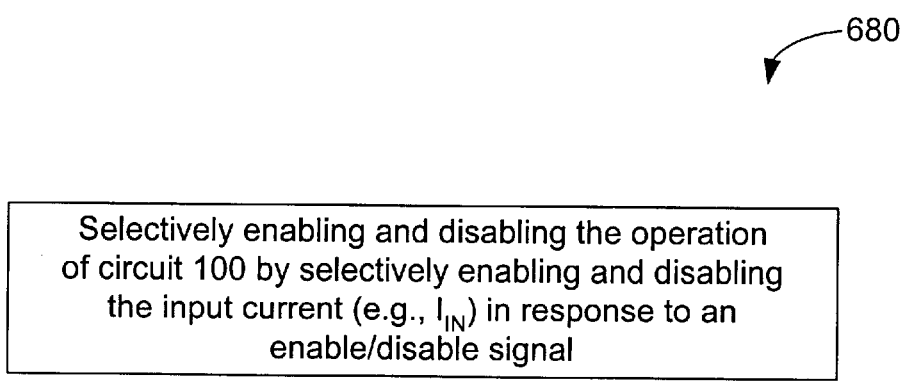
FIG. 6E is a flowchart of an example method of selectively enabling and disabling the circuit of FIG. 2.
Figure 7A:
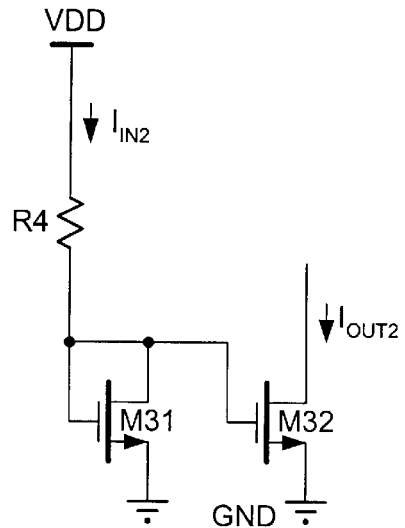
FIG. 7A is a circuit diagram of a conventional simple current mirror.
Figure 7B:
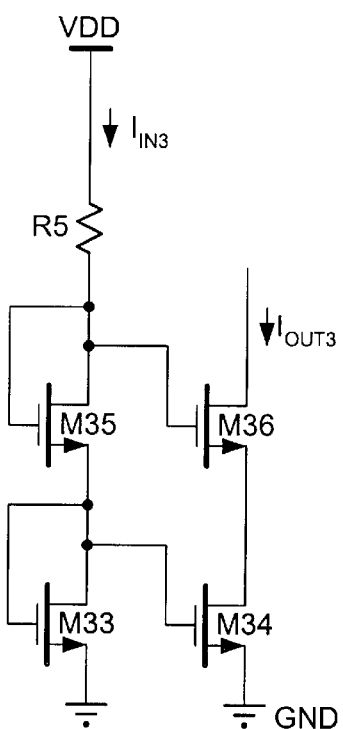
FIG. 7B is a circuit diagram of a conventional cascode current mirror.
Figure 7C:
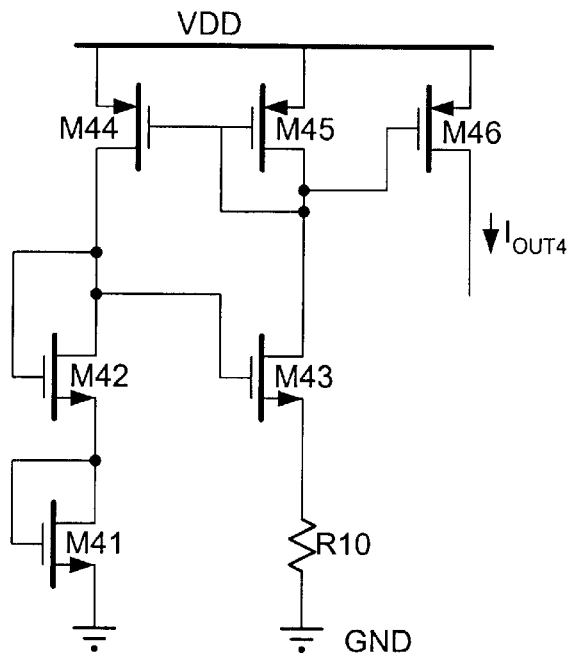
FIG. 7C is a circuit diagram of a conventional self-biased current mirrors.
Figure 7D:
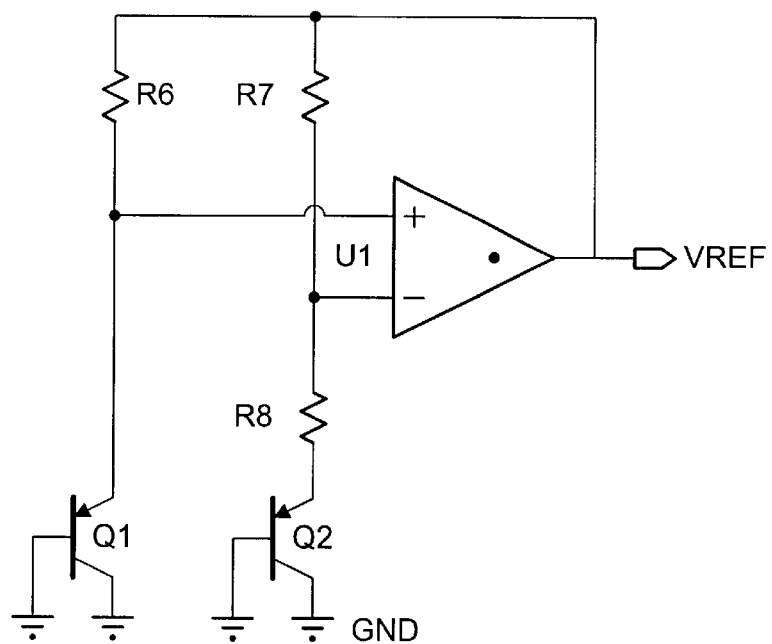
FIG. 7D is a circuit diagram of a conventional bandgap reference circuit used to create controlled reference voltages.

FIG. 6E is a flow chart of an example method 685 of selectively enabling and disabling bias circuit 100. Method 685 includes the step of selectively enabling and disabling the operation of bias circuit 100 by selectively enabling and disabling the input current (for example, $I_{IN}$) in response to an enable/disable signal Conclusion While various embodiment of the present invention have been described above, it should be understood that they have been presented by way of example only, and not limitation. Thus, the breadth and scope of the present invention should not be limited by any of the above-described exemplary embodiments and arrangements, but should be defined only in accordance with the following claims and their equivalents.

The present invention has been described above with the aid of functional building blocks and circuit diagrams illustrating the performance of specified functions and relationships thereof. The boundaries of the functional building blocks have been arbitrarily defined herein for the convenience of the description. Alternate boundaries can be defined so long as the specified functions and relationships thereof are appropriately performed. Any such alternate boundaries are thus within the scope and spirit of the claimed invention. One skilled in the art will recognize that these functional building blocks can be implemented using discrete circuit components, circuit components constructed on an IC chip, or any combination thereof. Thus, the breadth and scope of the present invention should not be limited by any of the above-described exemplary embodiments, but should be defined only in accordance with the following claims and their equivalents.

What is claimed is:

1. A bias circuit for establishing a plurality of bias voltages from an input current supplied to an input terminal of the circuit, comprising:
   an input stage adapted to establish a first bias voltage at the input terminal in response to the input current;
   a current stage adapted to produce a bias current and a main mirror current each proportional to the input current in response to the first bias voltage and a second bias voltage;
   a feedback stage adapted to produce a feedback current proportional to the input current in response to the bias current and the main mirror current; and
   a reference bias stage adapted to establish the second bias voltage in response to the feedback current from the feedback stage, whereby the first and second bias voltages track the input current over variations in at least one of process, temperature and power supply voltage.

2. The circuit of claim 1, wherein the feedback stage includes:
   a reference voltage stage adapted to establish third and fourth bias voltages in response to the bias current and the main mirror current; and
   a current source adapted to produce the feedback current in response to the third and fourth bias voltages.

3. The circuit of claim 2, wherein the reference voltage stage includes:
   a bias stage adapted to establish the third bias voltage in response to the bias current; and
   a reference stage adapted to establish the fourth bias voltage in response to the main mirror current and the third bias voltage.

4. The circuit of claim 2, wherein:
   the input stage and the reference bias stage are each constructed using transistors of a first type such that the first and second bias voltages are suitable for biasing current sources constructed using transistors of the first type; and
   the reference voltage stage is constructed using transistors of a second type complementary to the first type such that the third and fourth bias voltages produced thereby are suitable for biasing current sources constructed using transistors of the second type.

5. The circuit of claim 2, wherein the reference voltage stage is constructed using p-type Metal Oxide Semiconductor (PMOS) transistors such that the third and fourth bias voltages established thereby are suitable for biasing one or more current sources constructed using PMOS transistors.

6. The circuit of claim 1, wherein the input stage and the reference bias stage are each constructed using n-type Metal Oxide Semiconductor (NMOS) transistors such that the first and second bias voltages established thereby are suitable for biasing one or more current sources constructed using NMOS transistors.

7. The circuit of claim 1, wherein:
   the input stage includes an input transistor configured as a diode and connected between the input terminal and a power supply rail of the circuit, thereby establishing a gate-source voltage and a drain-source voltage of the input transistor corresponding to the input current; and
   the current stage includes a bias current stage having
      a first transistor adapted to produce the bias current, the first transistor having a gate connected to the input terminal to establish a gate-source voltage of the first transistor equal to a gate-source voltage of the input transistor, and
      a second transistor connected to the first transistor in a cascode configuration and adapted to maintain a source-drain voltage of the first transistor equal to the source-drain voltage of the input transistor in response to the second bias voltage such that the bias current produced by the first transistor is proportional to the input current.

8. The circuit of claim 1, wherein:
   the input stage includes an input transistor configured as a diode and connected between the input terminal and a power supply rail of the circuit, thereby establishing a gate-source voltage and a drain-source voltage of the input transistor corresponding to the input current; and
   the current stage includes a main mirror current stage having
      a first transistor adapted to produce the main mirror current, the first transistor having a gate connected to the input terminal to establish a gate-source voltage of the first transistor equal to a gate-source voltage of the input transistor, and
      a second transistor connected to the first transistor in a cascode configuration and adapted to maintain a source-drain voltage of the first transistor equal to the source-drain voltage of the input transistor in response to the second bias voltage such that the main mirror current produced by the first transistor is proportional to the input current.

9. The circuit of claim 1, further comprising:
   an input resistor, connected between a first power supply rail at a first power supply voltage and the input terminal, to set a value of the input current supplied to the input terminal,
   wherein the input stage is connected between the input terminal and a second power supply rail at a second power supply voltage, the input stage being adapted to provide a voltage drop between the input terminal and the second power supply rail approximating a voltage drop across a single diode, whereby the input stage minimizes sensitivity of the circuit to fluctuations in the first power supply voltage.

10. The circuit of claim 9, wherein the input stage is a transistor configured as a diode connected between the input terminal and the second power supply rail.

11. The circuit of claim 1, wherein the input stage, the current stage, the feedback stage, and the reference bias stage are all constructed on an integrated circuit (IC) chip, the circuit further comprising an input resistor connected between a power supply rail external to the IC chip and the input terminal such that the input resistor is external to the IC chip.

12. The circuit of claim 1, further comprising a start-up stage adapted to provide a trickle-current to the reference bias stage to force the circuit into a stable operating condition.

13. The of circuit of claim 12, wherein the start-up stage is adapted to reduce the trickle current from an initial current value to a final current value in response to a rise in the second bias voltage established by the reference bias stage.

14. The circuit of claim 12, wherein the start-up stage includes one of
   a resistor connected between a terminal common to both the feedback stage and the reference bias stage and a power supply rail, and a plurality of transistors having their respective source-drain current paths connected in series with one another, the series connected source-drain paths being connected between a power supply rail and a terminal common to both the feedback stage and the reference bias stage.

15. The circuit of claim 1, further comprising a shut-down stage adapted to selectively enable and disable the supply of the input current to the input terminal so as to selectively enable and disable an operation of the circuit, respectively.

16. The circuit of claim 15, wherein the shut-down stage includes a transistor having a source-drain path connected to the input terminal and being adapted to shunt the input current away from the input terminal so as to disable the operation of the circuit in response to a control voltage applied to a control electrode of the transistor.

17. The circuit of claim 1, wherein:

the input stage is a transistor configured as an input diode connected between the input terminal and a first power supply rail connected to the circuit; and the input diode, the current stage, the feedback stage, and the reference bias stage are all constructed on an integrated circuit (IC) chip, the circuit further comprising a bypass capacitor connected in parallel with the input diode and external to the IC chip, whereby the capacitor reduces thermal noise in the circuit.

18. The circuit of claim 1, wherein:

the current stage and the reference bias stage each include one or more current setting transistors in a first tier, each of the one or more first tier transistors being connected to a corresponding one of one or more cascode transistors in a second tier, all of the transistors at each tier being of such physical transistor dimensions that the current density in each first tier transistor is the same as the current density in each corresponding second tier transistor; and the feedback stage includes one or more cascode transistors in a third tier each connected to a corresponding one of one or more current setting transistors in a fourth tier, all of the transistors in the third tier and all of the transistors in the fourth tier being of such physical transistor dimensions that the current density in each third tier transistor is the same as the current density in each corresponding fourth tier transistor.

19. A method of establishing a plurality of bias voltages suitable for biasing current sources from an input current supplied to a bias circuit, comprising:

(a) supplying an input current;

(b) establishing a first bias voltage in response to the input current;

(c) producing a bias current proportional to the input current in response to the first bias voltage and a second bias voltage;

(d) producing a main mirror current proportional to the input current in response to the first bias voltage and the second bias voltage;

(e) producing a feedback current proportional to the input current in response to the bias current and the main mirror current; and (f) establishing the second bias voltage in response to the feedback current of step (e), whereby the first and second bias voltages track the input current over variations in at least one of a temperature of the bias circuit and a power supply voltage provided to the bias circuit.

20. The method of claim 19, wherein step (e) comprises:

(e)(i) establishing third and fourth bias voltages in response to the bias current and the main mirror current; and (e)(ii) producing the feedback current in response to the third and fourth bias voltages.

21. The method of claim 20, wherein:

step (b) and step (f) together comprise establishing the respective first and second bias voltages such that the first and second bias voltages are suitable for biasing one or more current sources of a first type; and step (e)(i) comprises establishing the third and fourth bias voltages such that the third and fourth bias voltages are suitable for biasing current sources of a second type complementary to the first type.

22. The method of claim 19, further comprising:

supplying a trickle current to establish a stable operating condition of the circuit.

23. The method of claim 22, further comprising:

reducing the trickle current from an initial current value to a final current value in response to a rise in the second bias voltage indicative of the stable operating condition.

24. The method of claim 19, further comprising:

selectively enabling and disabling the circuit by selectively enabling and disabling the input current in step (a) in response to an enable/disable signal.

* * * * *

UNITED STATES PATENT AND TRADEMARK OFFICE
CERTIFICATE OF CORRECTION

| | | |
|---|---|---|
| PATENT NO. | : 6,531,923 B2 | Page 1 of 1 |
| DATED | : March 11, 2003 | |
| INVENTOR(S) | : Lawrence M. Burns | |

It is certified that error appears in the above-identified patent and that said Letters Patent is hereby corrected as shown below:

<u>Column 4,</u>
Line 24, please replace "122" with -- 120 --.

<u>Column 5,</u>
Line 4, please delete "the bulk".

Signed and Sealed this

Ninth Day of September, 2003

JAMES E. ROGAN
*Director of the United States Patent and Trademark Office*